United States Patent [19]

Johnston et al.

[11] Patent Number: 5,650,748
[45] Date of Patent: Jul. 22, 1997

[54] ULTRA-STABLE GAIN CIRCUIT

[75] Inventors: Russell W. Johnston; Jeffrey A. Eck, both of Huntington Beach, Calif.

[73] Assignee: McDonnell Douglas Corporation, Huntington Beach, Calif.

[21] Appl. No.: 581,322

[22] Filed: Dec. 28, 1995

Related U.S. Application Data

[63] Continuation-in-part of Ser. No. 201,318, Feb. 24, 1994, abandoned.

[51] Int. Cl.$^6$ ................................................. H03K 3/30
[52] U.S. Cl. .................... 327/560; 327/561; 327/513; 327/363; 327/190; 330/294
[58] Field of Search ............................ 330/294, 107, 330/109; 327/187, 190, 306, 509, 512, 513, 561, 443, 362, 363, 560

[56] References Cited

U.S. PATENT DOCUMENTS

| | | | |
|---|---|---|---|
| 1,420,115 | 1/1922 | Wittmer | 330/109 |
| 3,436,675 | 4/1969 | Lunau | 330/109 |
| 4,060,771 | 11/1977 | Melcher et al. | 330/59 |
| 4,156,859 | 5/1979 | Forward et al. | 333/213 |

FOREIGN PATENT DOCUMENTS 0188910  11/1983  Japan ...................................... 330/294

OTHER PUBLICATIONS

G.E. O'Neil (High Frequency operational amplifier), IBM Technical Disclosure Bulletin, vol. 26, No. 2, Jul. 1983, p. 598.

*Primary Examiner*—Timothy P. Callahan
*Assistant Examiner*—Dinh T. Le
*Attorney, Agent, or Firm*—Ronald M. Goldman

[57] ABSTRACT

A highly stable linear integrated circuit amplifier (11) is incorporated in a circuit (10) employing transformer (18) feedback providing thermal gain stability determined solely by the transformer turns ratio.

7 Claims, 2 Drawing Sheets

5,650,748

ULTRA-STABLE GAIN CIRCUIT

This is a continuation-in-part of Ser. No. 08/201,318 filed Feb. 24, 1994, now abandoned.

FIELD OF THE INVENTION

The present invention relates generally to an electronic amplifier circuit, and, more particularly, to such a circuit that has a gain substantially completely independent of temperature variation.

DESCRIPTION OF RELATED ART

There are many situations, both commercial and military, in which an amplifier is required in electronic apparatus or equipment that will provide reliable predetermined gain substantially independent from customary variations in environmental temperature and, in that way, minimize the possibility of amplifier gain errors from that source. In addition, if a differential output is required, it is necessary to provide multiple operational amplifiers that are interconnected. To achieve such a design, according to conventional state of the art, requires matched precision resistor sets in order to assure modest gain stability with temperature change.

However, the resistor approach is only feasible where the various resistors required can be matched over the temperature range fully expected. This is considerably difficult to accomplish in practice since individual resistors not only change their value with age, but also change value due to hysteresis on temperature cycling, physical placement of circuit components, degree of individual resistor heat sinking, and other factors.

SUMMARY OF THE INVENTION

It is a primary object and aim of the present invention to provide a temperature stable amplifier circuit excluding conventional resistive feedback means.

A further object in accordance with the preceding object is the provision of D.C. feedback for an operational amplifier without loading and A.C. feedback via inductive coupling.

In accordance with the practice of the present invention, a highly stable linear integrated circuit amplifier, frequently referred to as an "operational amplifier", is incorporated into a circuit employing transformer feedback with gain determined substantially solely by the turns ratio of the transformer.

It can be shown that the turns ratio of a transformer can be made substantially thermally insensitive up to the point of the transformer core permeability change with temperature. Variations are usually detectable at about 50° C. below the so-called Curie point (temperature above which ferromagnetic properties are lost) of the metal core. In typical transformers for electronics purposes, the Curie point of iron-based cores are in the range of 350° C. so that the turns ratio range of independence from practical heat variance is considerable and well above that temperature where resistor values start to diverge causing subsequent gain variation of the overall amplifying system.

The described feedback circuit for an operational amplifier includes a pair of inductively coupled and serially connected transformer elements provides a path for D.C. feedback signals. The common connection for the coupled transformer windings is connected to ground via a capacitor forming A.C. current paths for each transformer element. A further transformer winding is coupled to provide an output.

DESCRIPTION OF A PREFERRED EMBODIMENT

The present invention has for its primary objective the provision of an A.C. amplifying circuit especially advantageous for use at elevated temperatures. This circuit provides a thermally independent gain to the greatest practical extent resulting in minimization of gain errors and very high reliability through the use of a minimal number of thermally insensitive parts, high efficiency, minimum distortion and being of relatively minimum size.

Figure 1:
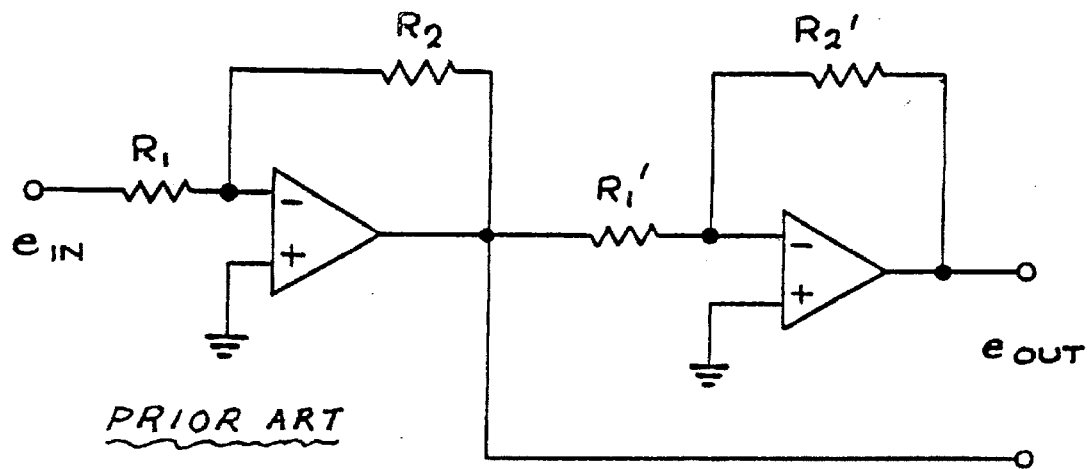
FIG. 1 is a prior art circuit depiction with differential output.

FIG. 1 shows a typical approach that would be taken to accomplish providing a desirable output voltage swing utilizing state of the art circuitry employing resistors. However, in order to meet all of the requirements for the present invention, such a circuit requires a matched precision resistor set $(R_1, R_2)$ and further sets matched to the first set $(R_1', R_2')$ in order to provide good stability over a wide range of temperature variation. Also, even if the required resistor values can be matched initially, there is a problem that resistors typically tend to change their values over extended use and have a hysteresis effect on temperature cycling causing them not to return precisely to original values with each temperature cycle, particularly the initial cycle. Accordingly, an undesirable variation in gain is obtained irrespective of initial matching precision.

Figure 2:
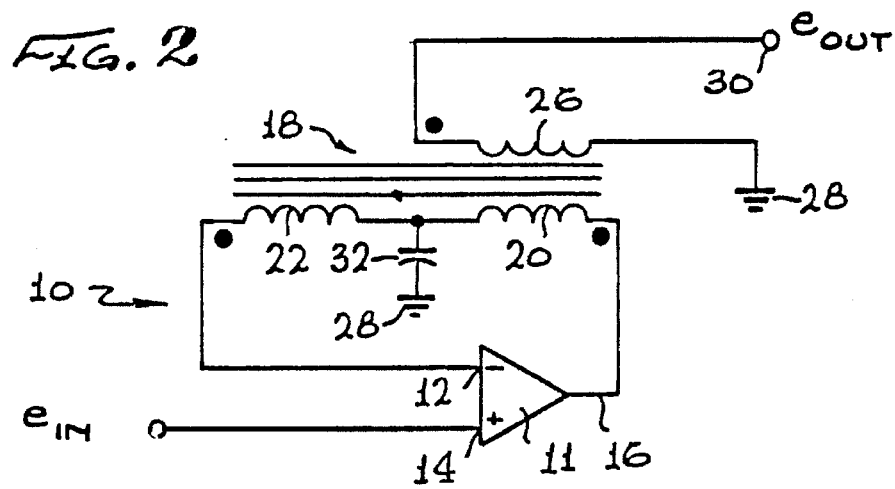
FIG. 2 is a circuit schematic of the invention.

Turning now to FIG. 2 and a preferred embodiment of the invention, there is disclosed an amplifying circuit 10 having a gain that does not change throughout a large range of temperature where A.C. amplification is a requirement. In its major parts, the amplifying circuit 10 includes an operational amplifier 11 with first and second input terminals 12 and 14 and a single output terminal 16. A transformer 18 is interconnected in a feedback loop from the output terminal 16 of the operational amplifier to the first input terminal 12. More particularly, the transformer 18 includes first and second windings 20 and 22 serially arranged between the operational amplifier output terminal and the first input terminal 12 further identified as of negative electric polarity (−), which windings are connected in opposition to one another as indicated by the polarity dot symbols.

A third winding 26 which is coupled with the windings 20 and 22 has one winding end connected to ground 28 and the other end serving as an output terminal 30. A capacitor 32 has one side connected to the common point 34 of windings 20 and 22 and its other side is electrically grounded. Functionally, the described circuit of FIG. 2 is non-inverting.

Although, as indicated above, A.C. amplification is a primary functional requirement for this circuit, operational amplifiers inherently provide gain down to D.C. Accordingly, even if output D.C. offset is made close to zero by the use of additional components, the amplifier output will tend to make an excursion to or very near to either the positive or negative power supply voltage since the D.C. differential input offset will always be finite and known operational amplifiers will force their output in a direction causing the differential input to approach zero. For this reason, the transformer 18 has windings 20 and 22 arranged in series to provide a D.C. path for the operational amplifier to compensate input D.C. offsets and thereby drive its D.C. output to a value very close to zero. More particularly, the D.C. feedback produces no alternating flux in windings 20 and 22, and has no path to ground since it is blocked by the capacitor 32 and the operational amplifier 11, the latter presenting substantially an infinite impedance between such D.C. feedback and ground. Therefore, no loading is produced by the D.C. feedback.

It is necessary in order to obtain A.C. feedback, and in that way set an A.C. gain point, that the two windings 20 and 22 be coupled with the polarity as indicated by the dot convention (i.e., in opposition). With this coupling arrangement, winding 20 is inductively coupled to winding 22 for establishing the serial A.C. feedback path to the input of the operational amplifier.

As for detailed aspects of feedback, an A.C. output from the operational amplifier has a current path through transformer winding 20 and the capacitor 32 to ground while, as already noted, D.C. output has a direct path through the windings 20 and 22 with no inductive or coupling effect. Passage of A.C. current through winding 20 induces a signal in winding 22 which provides a corresponding A.C. feedback to amplifier input terminal 12 via a circuit path through winding 22 and capacitor 32 to ground.

It is important to note that although the operational amplifier A.C. gain is set by the ratio of windings 20 and 22, the circuit gain is set by the ratio of windings 22 and 26 independent of winding 20 as shown by the following mathematical derivation:

$$e_{out} = N3/N1 \times (V_{4-5})$$

$$V_{1-3} = e_{in} = V_{4-5} \times (N2/N1)$$

or:

$$V_{4-5} = (N1/N2) \times e_{in}$$

therefore:

$$e_{out} = (N3/N1) \times (N1/N_2) \times e_{in} = (N3/N2) \times e_{in}$$

$$\text{Gain} = (e_{out}/e_{in}) = N3/N2$$

Where

N1—the number of turns in winding 20

N2=the number of turns in winding 22

N3=the number of turns in winding 26

$V_{4-5}$=voltage across winding 20

$V_{1-3}$=voltage across winding 22

Still referring to operational aspects of the FIG. 2 circuit, since there is no D.C. current passing through either windings 20 or 22, winding resistance is of little concern. However, since the resistance of winding 20 is located in the operational amplifier feedback path, this resistance is compensated for as far as A.C. gain is concerned. With proper design of winding 20, the winding could serve as the output line termination impedance. The only losses would then be the leakage reactance for windings 20 and 26, core loss and resistive loss in 26. All of these latter effects can be readily and practicably controlled with proper transformer design.

Frequency response of the described circuit is essentially controlled by the roll-off response of the operational amplifier as well as the transformer leakage reactance. There is a wide selection of available operational amplifiers exhibiting an equally wide range of frequency response, and the transformer leakage reactance can be controlled by appropriate well established design techniques. Specifications of existing commercially available transformers show that winding to winding coupling capacity can be held to less than several picofarads which, for almost all practical applications, is more than adequate.

Figure 3:
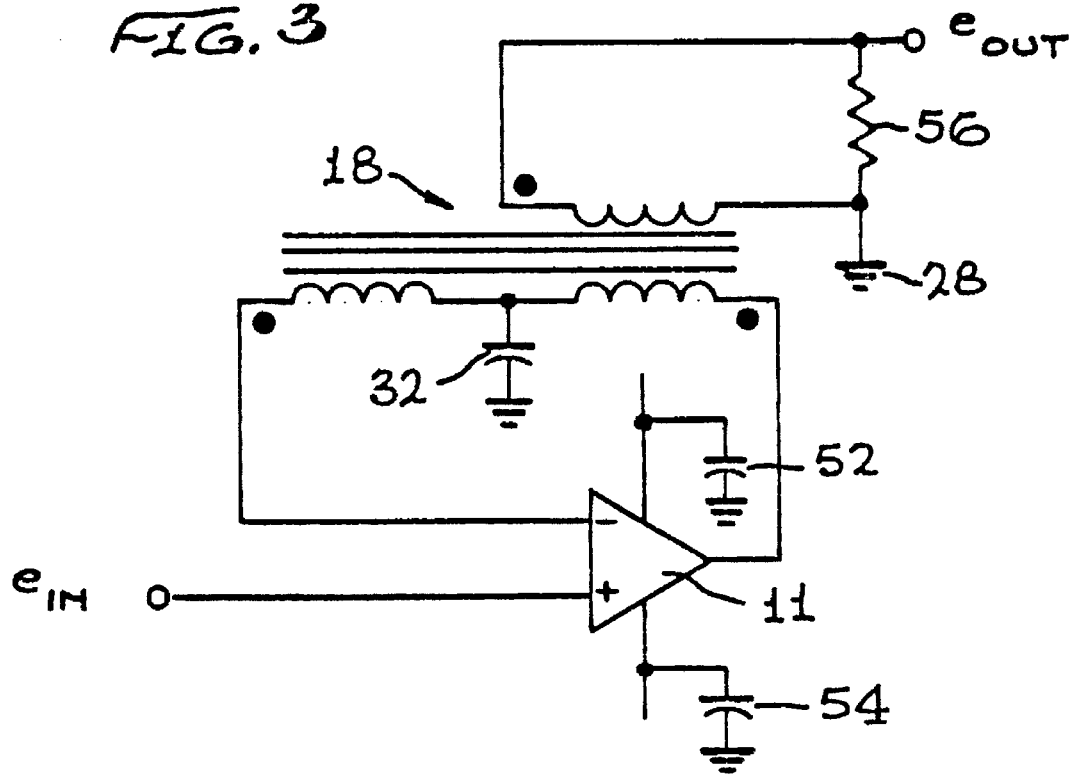
FIG. 3 is a depiction of a practical construction of the invention used in testing.

In a practical construction of the invention shown in FIG. 3, the transformer employed was marketed by Pico Electronics under the trade designation Y-27085, the operational amplifier was obtained from Fairchild as part No. μA741, and the capacitor 32 was a 6 μF, 50 VDC, nonpolarized part. Capacitors 52 and 54 were both 0.1 μF, 50 VDC, nonpolarized parts, and load resistor 56 was 330 ohms.

The described amplifying circuit has been specifically presented for use with a so-called "operational amplifier", the latter being more particularly considered as a relatively highly stable linear amplifier of solid-state or integrated circuit construction. It is contemplated, however, that the present invention can be usefully employed with any solid-state linear amplifier.

Although the invention has been described in connection with preferred embodiments, it is to be understood that those skilled in the appertaining arts may effect modifications which come within the scope of the disclosed invention as well as within the ambit of the appended claims.

What is claimed is:

1. A linear amplifying circuit, comprising a linear amplifier having first and second inputs and an output, said first input for receiving an input voltage and said second input comprising a high impedance and said linear amplifying circuit employing a ground and an external feedback circuit connected between said output and said second input, the feedback circuit comprising:

transformer means, said transformer means having a core of magnetic material, first and second windings inductively coupled to one another on said core, said first and second windings each having a first polarity end and a second polarity end; said second polarity end of each of said first and second windings being connected together to place said first and second windings electrically in series and, said first polarity ends of said first and second windings being connected, respectively, to said output and said second input to provide a DC connection from said output to said second input; and a capacitor connected between said second polarity ends of said first and second windings and said ground, said capacitor for completing an A.C. signal path from said output through one of said first and second transformer windings to said ground, wherein said A.C. signal through said one of said first and second transformer windings magnetically induces an induced A.C. signal across the other of said first and second transformer windings to place said induced A.C. signal at said second input of said linear amplifier, whereby said linear amplifying circuit provides a gain that is stable with respect to changes in ambient temperature.

2. The invention as defined in claim 1, wherein said transformer means includes a third winding, said third winding being inductively coupled on said core to said first and second windings, said third winding defining an isolated output for said linear amplifying circuit.

3. The invention as defined in claim 2, wherein said first winding comprises N1 turns; said first polarity end of said first winding is connected to said output of said linear amplifier; said second winding comprises N2 turns; and said first polarity end of said second winding is connected to said second input of said linear amplifier.

4. An amplifying circuit for providing a gain that is independent of temperature over a range of temperatures, comprising:

an operational amplifier having negative and positive input terminals and an output terminal; said positive input terminal for receiving an input voltage;

an electrical ground;

a transformer having a core of magnetic material, and first, second and third windings coupled to said core, each of said first and second windings having a first magnetic polarity end and a second magnetic polarity end, said first and second windings being connected in series circuit at a juncture and having said first magnetic polarity winding ends oriented in magnetic opposition to one another;

said series circuit connected between said operational amplifier output terminal and said negative input terminal to establish a DC connection there between;

a capacitor connected between said juncture of said first and second windings and said electrical ground for completing circuit paths from one of said first and second windings to said electrical ground for A.C. signals originating from said operational amplifier output, whereby A.C. current through said one of said first and second windings induces a corresponding A.C. signal across the other of said first and second windings for application to said negative input terminal; and an electrical output terminal on one end of said third transformer winding, and said remaining end of said third winding end being connected to said electrical ground.

5. The invention as defined in claim 4, wherein said second winding is connected to said negative input terminal of said operational amplifier and comprises N2 turns; and wherein said first winding is connected to said output of said operational amplifier and comprises N1 turns.

6. The invention as defined in claim 5, wherein said third winding comprises N3 turns; and wherein said amplifying circuit produces a gain that is directly proportional to the ratio of N3 to N2.

7. A temperature stable amplifier circuit comprising:

an operational amplifier, said operational amplifier including an input for receiving an input voltage, $E_{IN}$, for amplification to produce an output voltage, $E_{OUT}$, a high impedance feedback input for receiving feedback voltages, and an output;

transformer means containing a core of magnetic material and a plurality of transformer windings on said core; said magnetic core having a predetermined Curie point; said plurality of transformer windings including a first primary winding having N1 turns, a first polarity winding end and a second polarity winding end; a feedback winding having N2 turns, a first polarity winding end and a second polarity winding end; and an output winding having N3 turns;

said first primary winding and said feedback winding being connected in series at a juncture between said amplifier output and said feedback input to said amplifier, whereby DC voltage at said amplifier output is provided to said feedback input, with said windings being connected in series at said winding ends of the same polarity;

capacitor means connected between said juncture between said first primary winding and said feedback winding and ground to produce an AC ground at said juncture, while maintaining said juncture DC isolated from ground, whereby AC current output from said amplifier output flows through said first primary winding through said capacitor means to said ground, whereby said AC current through said first primary winding induces AC voltage in each of said output winding and said feedback winding; and wherein said AC voltage induced in said feedback winding is applied to said high impedance feedback input concurrently with any DC voltage from said amplifier output to enable a gain for said amplifier circuit that is equal to N3/N2, when said transformer core is at a temperature below said predetermined Curie point; whereby the voltage across said output winding, $E_{OUT}$ is equal to the product $(E_{IN})(N3/N2)$.

\* \* \* \* \*